(12) United States Patent
Shimo et al.

(10) Patent No.: US 6,297,636 B1
(45) Date of Patent: Oct. 2, 2001

(54) RF COIL, RF MAGNETIC FIELD GENERATING APPARATUS AND MAGNETIC RESONANCE IMAGING METHOD AND APPARATUS

(75) Inventors: Yukitoshi Shimo; Kazuya Hoshino, both of Tokyo (JP)

(73) Assignee: GE Yokogawa Medical Systems, Limited, Tokyo (JP)

(*) Notice: Subject to any disclaimer, the term of this patent is extended or adjusted under 35 U.S.C. 154(b) by 0 days.

(21) Appl. No.: 09/481,073

(22) Filed: Jan. 11, 2000

(51) Int. Cl.$^7$ .................................................. G01V 3/00
(52) U.S. Cl. ................................... 324/318; 324/322
(58) Field of Search ............................. 324/318, 322, 324/314, 307; 600/407

(56) References Cited

U.S. PATENT DOCUMENTS

| | | | |
|---|---|---|---|
| 4,506,224 | 3/1985 | Krause | 324/318 |
| 4,592,363 | 6/1986 | Krause | 324/318 |
| 5,696,449 | 12/1997 | Boskamp | 324/318 |
| 5,699,802 | * 12/1997 | Duerr | 324/318 |
| 5,777,474 | * 7/1998 | Srinivasan | 324/318 |

OTHER PUBLICATIONS

I. Viohl "Circular polarized RF cois for open magnetic system" Proceedings of Society of Magnetic Resonance; 3rd meeting, Aug. 19–25, 1995, vol. 1, p. 183.

S. Junge "Optimization of a quadrature whole body resonator for 2I", Proceeding of Internation Society for Mag. Res. May 22–28, 1999; vol. 3, p 2053.

E.B. Boskamp "Vertifical Field Open RF body cois" Proceedings of Int. Soc. for Magnetic Resoance in Medicine May 22–28, 1999, vol. 1 p. 736.

* cited by examiner

Primary Examiner—Jay Patidar
Assistant Examiner—Brij B. Shrivastav
(74) Attorney, Agent, or Firm—Moonray Kojima

(57) ABSTRACT

In order to generate an RF magnetic field efficiently, an RF coil is used comprising electric paths 612 carrying electric current for generating the RF magnetic field within a space containing a subject, and an annular electric path 614 located farther from the subject than the electric paths 612 from the subject, for linking respective ends of the electric paths 612.

18 Claims, 9 Drawing Sheets

Direction of RF magnetic field

Direction of RF magnetic field

RF COIL, RF MAGNETIC FIELD GENERATING APPARATUS AND MAGNETIC RESONANCE IMAGING METHOD AND APPARATUS

BACKGROUND OF THE INVENTION

The present invention relates to an RF (radio frequency) coil, RF magnetic field generating apparatus and magnetic resonance imaging method and apparatus, and more particularly to an RF coil having a plurality of electric paths carrying electric current for generating an RF magnetic field and an annular electric path linking respective ends of the plurality of electric paths, an RF magnetic field generating apparatus employing such an RF coil, and a magnetic resonance imaging method and apparatus employing such an RF magnetic field generating apparatus.

A magnetic resonance imaging apparatus having the direction of a static magnetic field perpendicular to the body axis of a subject, commonly referred to as a vertical magnetic field-type magnetic resonance imaging apparatus, generates an open static magnetic field space, and employs as an RF coil for generating an RF magnetic field an RF coil having a loop surface parallel to pole piece surfaces of a static magnetic field generating unit. The RF coil of this type generates the RF magnetic field in the direction parallel to the coil loop surface to form the RF magnetic field perpendicular to the direction of the static magnetic field. Such an RF coil is disclosed in U.S. Pat. No. 5,760,583 of the present applicant.

On the other hand, there is another type of an RF coil referred to as a quadrature RF coil, which consists of a combination of two RF coils, and can provide an RF magnetic field having an increased strength by vector composition of respective RF magnetic fields generated by the two RF coils or can reduce a drive power per coil to obtain the RF magnetic field of a desired strength.

However, in the conventional RF coils, an unwanted RF magnetic field is generated from electric current flowing through tie paths for linking main paths. Since the unwanted RF magnetic field cancels the RF excitation magnetic field generated from the main paths, efficiency in generating the RF magnetic field is reduced and a larger electric power for excitation is required to obtain a desired magnetic field strength.

Moreover, the electric current flowing through the main paths and the tie paths becomes larger correspondingly, raising additional problem that the high frequency electric power absorption, i.e., the whole SAR (specific absorption rate), of the subject is increased.

Furthermore, the unwanted RF magnetic field generated by the tie paths not only cancels the RF excitation but also increases the local high frequency electric power absorption, i.e., the local SAL, of the subject.

SUMMARY OF THE INVENTION

It is therefore an object of the present invention to provide an RF coil and RF magnetic field generating apparatus that generates an RF magnetic field efficiently, and a magnetic resonance imaging method and apparatus employing such an RF magnetic field generating apparatus.

It is another object of the present invention to provide an RF coil and RF magnetic field generating apparatus that provides a small SAL of a subject, and a magnetic resonance imaging method and apparatus employing such an RF magnetic field generating apparatus.

In accordance with a first aspect of the invention, there is provided an RF coil comprising: radially extending electric paths carrying electric current for generating an RF magnetic field within a space containing a subject; and an annular electric path located farther from the space than the radially extending electric paths from the space, for linking respective ends of the radially extending electric paths.

In accordance with a second aspect of the invention, there is provided an RF coil comprising: a plurality of mutually parallel electric paths carrying electric current for generating an RF magnetic field within a space containing a subject; and annular electric paths disposed on both ends of the plurality of electric paths, located farther from the space than the plurality of electric paths from the space, for linking respective ends of the plurality of electric paths.

In accordance with a third aspect of the invention, there is provided an RF magnetic field generating apparatus comprising: radially extending electric paths carrying electric current for generating an RF magnetic field within a space containing a subject; an annular electric path located farther from the space than the radially extending electric paths from the space, for linking respective ends of the radially extending electric paths; and RF signal supply means for supplying RF signals having respective phases different by 90° from each other, respectively to two positions on the annular electric path having respective directions from the center of the annular electric path different by 90° from each other.

In accordance with a fourth aspect of the invention, there is provided an RF magnetic field generating apparatus comprising: a plurality of mutually parallel electric paths carrying electric current, for generating an RF magnetic field within a space containing a subject; annular electric paths disposed on both ends of the plurality of electric paths, located farther from the space than the plurality of electric paths from the space, for linking respective ends of the plurality of electric paths; and RF signal supply means for supplying RF signals having respective phases different by 90° from each other, respectively to two positions on either one of the annular electric paths having respective directions from the center of the annular electric path different by 90° from each other.

According to the present invention, the distance between the annular electric path and the subject is increased to reduce cancellation effect of the annular electric path on the RF excitation magnetic field, and also reduce the SAR of the subject.

Therefore, the present invention can provide an RF coil and RF magnetic field generating apparatus that generates an RF magnetic field efficiently, and a magnetic resonance imaging method and apparatus employing such an RF magnetic field generating apparatus.

Moreover, the present invention can provide an RF coil and RF magnetic field generating apparatus that provides a small SAL of a subject, and a magnetic resonance imaging method and apparatus employing such an RF magnetic field generating apparatus.

Further objects and advantages of the present invention will be apparent from the following description of the preferred embodiments of the invention as illustrated in the accompanying drawings.

FIGS. (16A)–16(D) are a schematic showing an exemplary pulse sequence for magnetic resonance imaging.

DETAILED DESCRIPTION OF THE INVENTION

Figure 1:
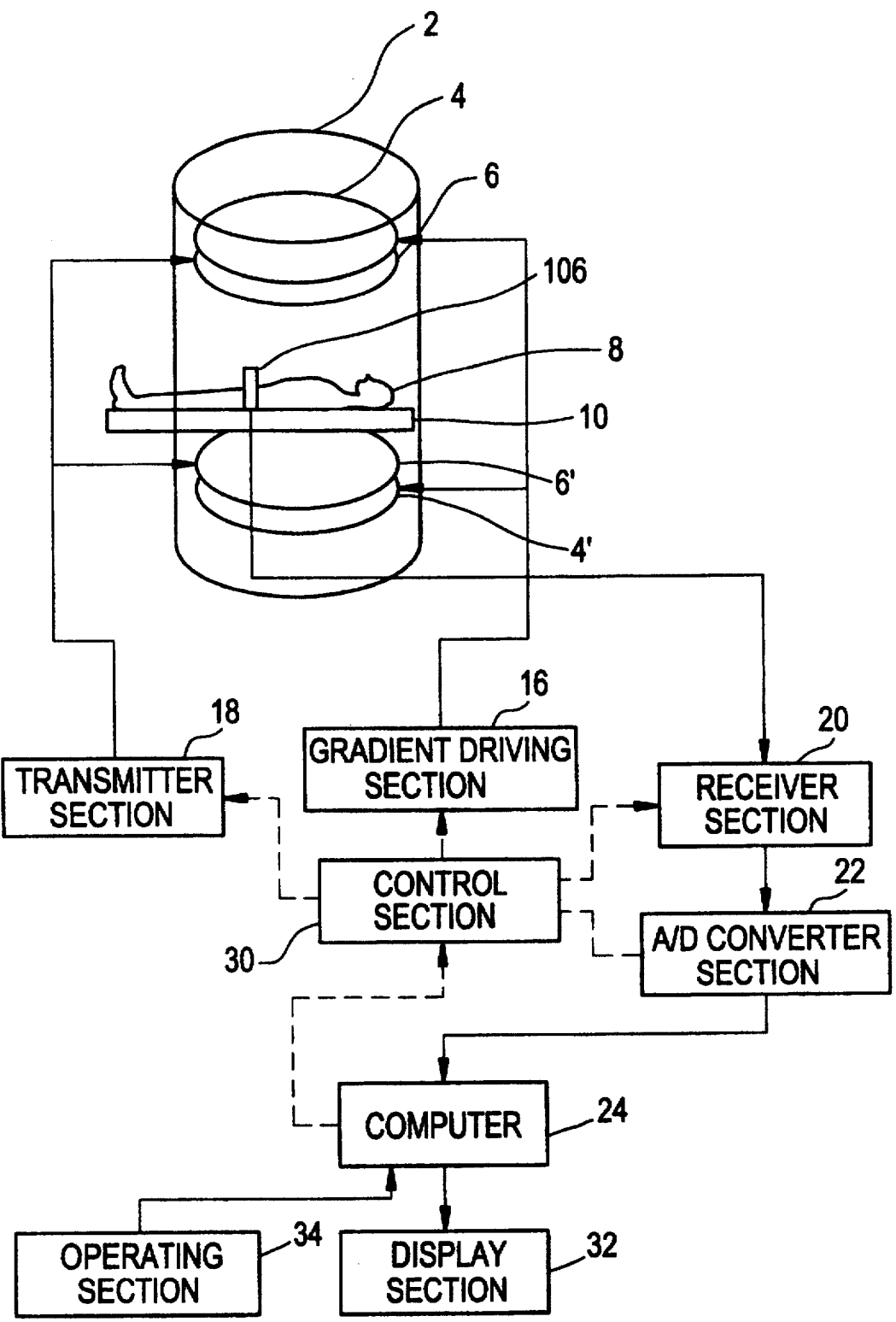
FIG. 1 is a block diagram of an apparatus in accordance with one embodiment of the present invention.

The embodiments of the present invention will now be described in more detail with reference to the accompanying drawings. FIG. 1 shows a block diagram of a magnetic resonance imaging apparatus, which is one embodiment of the present invention. The configuration of the apparatus represents an embodiment of the apparatus in accordance with the present invention, and the operation of the apparatus represents an embodiment of the method in accordance with the present invention.

As shown in FIG. 1, the apparatus comprises a static magnetic field generating section 2 for generating a homogeneous static magnetic field in its internal space. The static magnetic field generating section 2 comprises a pair of magnetism generators (not shown), such as permanent magnets, which face each other in the vertical direction in the drawing maintaining a certain distance, for generating the static magnetic field (vertical magnetic field) within the interposed space. It would be easily recognized that the magnetism generator is not limited to the permanent magnet but may be a superconductive electromagnet, a normal conductive electromagnet or the like.

Within the internal space of the static magnetic field generating section 2 are disposed gradient coil sections 4, 4' and transmit coil sections 6, 6' facing each other likewise in the vertical direction maintaining respective distances. Between the gradient coil sections 4, 4' and the transmitcoil sections 6,6', an RF shield (not shown in FIG. 1) is provided. The RF shield is constructed from a conductive material such as a copper foil. The transmit coil sections 6 and 6' together represent an embodiment of the RF coil of the present invention and will later be described in more detail.

A subject 8 is placed on an imaging table 10 and carried into or out of a space interposed between the opposing transmit coil sections 6 and 6' by carrying means (not shown). The body axis of the subject 8 is orthogonal to the direction of the static magnetic field. The imaging table 10 is attached with a receive coil section 106 surrounding an imaging site of the subject 8. The receive coil section 106 is directed to imaging the L-spine (lumbar spine), for example, and is attached enveloping the hip of the subject 8. It should be noted that the receive coil section 106 may be disposed not only around the L-spine but also at any position corresponding to a desired imaging site.

The gradient coil sections 4 and 4' are connected with a gradient driving section 16, which supplies a drive signal to the gradient coil sections 4 and 4' to generate gradient magnetic fields. The gradient magnetic fields to be generated are following three: a slice gradient magnetic field, a readout gradient magnetic field and a phase-encoding gradient magnetic field.

The transmit coil sections 6 and 6' are connected with a transmitter section 18, which supplies a drive signal to the transmit coil sections 6 and 6' to generate an RF magnetic field, thereby exciting spins within the subject 8.

The receive coil section 106 receives magnetic resonance signals generated by the excited spins. The receive coil section 106 is connected to the input of a receiver section 20 and inputs the received signals to it. The output of the receiver section 20 is connected to the input of an analog-to-digital (A-D) converter section 22, which converts an output signal of the receiver section 20 into a digital signal. The output of the A-D converter section 22 is connected to a computer 24.

The computer 24 receives the digital signal from the A-D converter section 22 and stores the signal into a memory (not shown).

In the memory is formed a data space that constitutes a Fourier space. The computer 24 performs an inverse Fourier transformation on the data in the Fourier space to reconstruct an image.

The computer 24 is connected to a control section 30, which is in turn connected to the gradient driving section 16, the transmitter section 18, the receiver section 20 and the A-D converter section 22. The control section 30 controls the gradient driving section 16, the transmitter section 18, the receiver section 20 and the A-D converter section 22 based on respective commands supplied from the computer 24 to perform magnetic resonance imaging.

The computer 24 is connected with a display section 32 that displays the reconstructed image and several information output from the computer 24, and an operating section 34 that is operated by a human operator inputting several commands and information to the computer 24.

Figure 2:
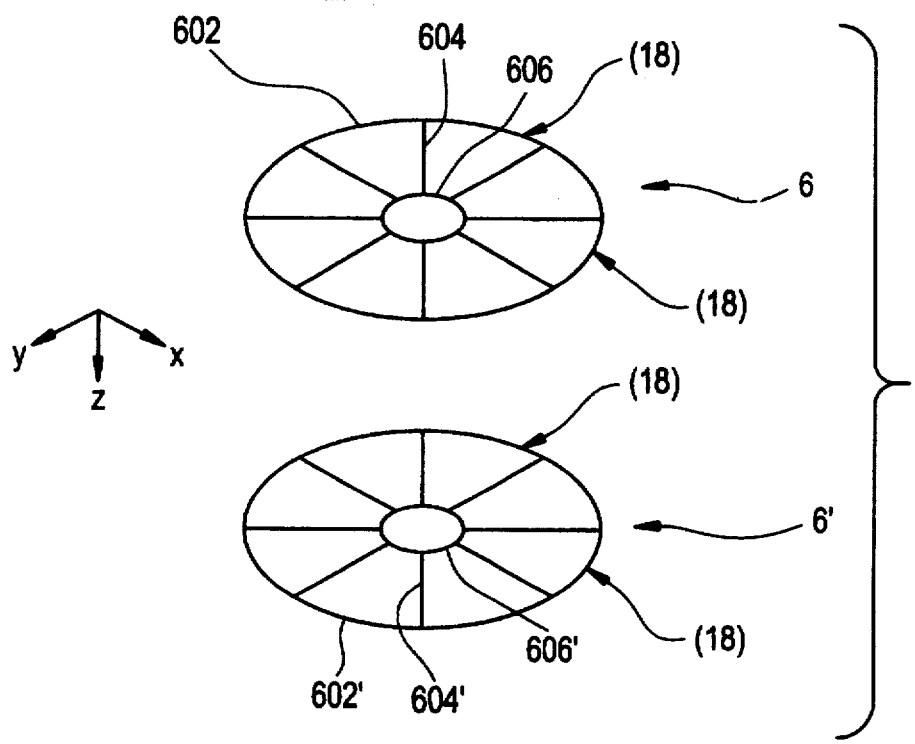
FIG. 2 is a schematic showing the configuration of a transmit coil section in the apparatus of FIG. 1.

FIG. 2 schematically shows the configuration of the transmit coil sections 6 and 6', wherein the three-dimensional structure of an RF coil that constitutes a main portion of the transmit coil sections 6 and 6' is illustrated. Three mutually orthogonal directions in the three-dimensional space is designated as x, y and z. The z-direction corresponds to the direction of the static magnetic field. As shown, the transmit coil section 6 has electric paths formed in an x-y plane, and the transmit coil section 6' has electric paths formed in another x-y plane spaced apart from the former one in the z-direction.

The transmit coil section 6 has an annular electric path 602, which represents an embodiment of the annular electric path of the present invention. Inside the annular electric path 602 are provided a plurality of electric paths 604 radially extending from a central portion. The electric paths 604 represent an embodiment of the radially extending electric paths of the present invention. The number of the radially extending electric paths 604 is eight, for example. However, the number of the electric paths 604 is not limited to eight but may be any integer multiple of four. It should be noted that designation for the electric paths 604 is represented by the reference numeral at one position in the drawing. Each of the electric paths 604 has one end connected to the electric path 602 and the other end connected to a central annular electric path 606.

Two positions on the electric path 602 that have respective directions from the inner center different by 90° from each other are supplied with respective RF signals from the transmitter section 18. The RF signals supplied to these two positions have respective phases different by 90° from each other.

The transmit coil section 6' has an annular electric path 602', which represents an embodiment of the annular electric path of the present invention. Inside the annular electric path 602' are provided a plurality of electric paths 604' radially extending from a central portion. The electric paths 604' represent an embodiment of the radially extending electric paths of the present invention. The number of the radially extending electric paths 604' is eight, for example. Again, the number of the electric paths 604' is not limited to eight but may be any integer multiple of four. It should be noted that designation for the electric paths 604' is represented by the reference numeral at one position in the drawing. Each of the electric paths 604' has one end connected to the electric path 602' and the other end connected to a central annular electric path 606'.

Two positions on the electric path 602' that have respective directions from the inner center different by 90° from each other are supplied with respective RF signals from the transmitter section 18. The RF signals supplied to these two positions have respective phases different by 90° from each other.

Figure 3:
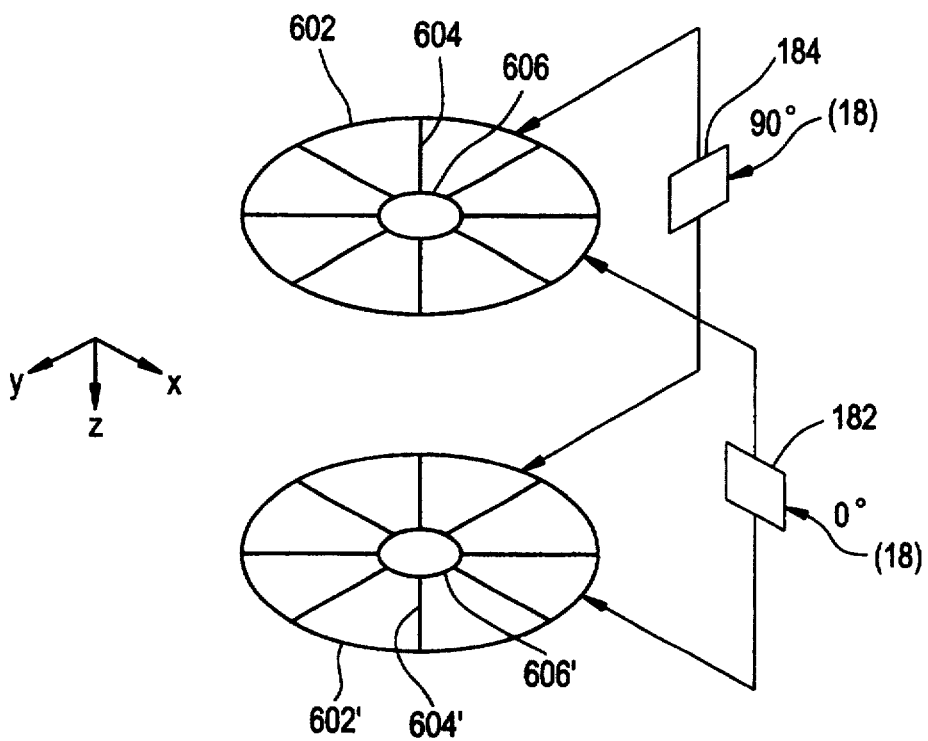
FIG. 3 is a schematic showing the configuration of the transmit coil section in the apparatus of FIG. 1.

Such transmit coil sections 6 and 6' face each other in a mirror image relationship to constitute the RFcoil of the present apparatus. The RF signal supply to the transmit coil sections 6 and 6' is performed by sending two RF signals that have respective phases different by 90° from each other output from the transmitter section 18, and dividing the RF signals equally in power by respective power splitters 182 and 184, as exemplarily shown in FIG. 3. Such supply of the RF signals is preferable in RF-driving the transmit coil sections 6 and 6' under the exactly identical condition. It should be noted that respective RF power amplifiers may be disposed as necessary between the splitters 182,184 and the transmit coil sections 6, 6'.

Since the RF signals having the same power and the same phase are thus simultaneously supplied to the two opposite coil loops from a common signal source, electromagnetic coupling between the coils is immaterial. In addition, electrostatic coupling between the coils is immaterial because the distance between the coils is sufficiently large. Thus, an RF coil having an excellent frequency property can be obtained.

Signal lines to supply the RF signals to the coils may be made from an appropriate signal line such as a concentric cable, and the lines can be led unrestrictedly. Therefore, it is easy to handle the signal lines without obstructing the subject 8 carried into the magnetic field space, and openness of the magnetic field space is not inhibited.

Figure 4:
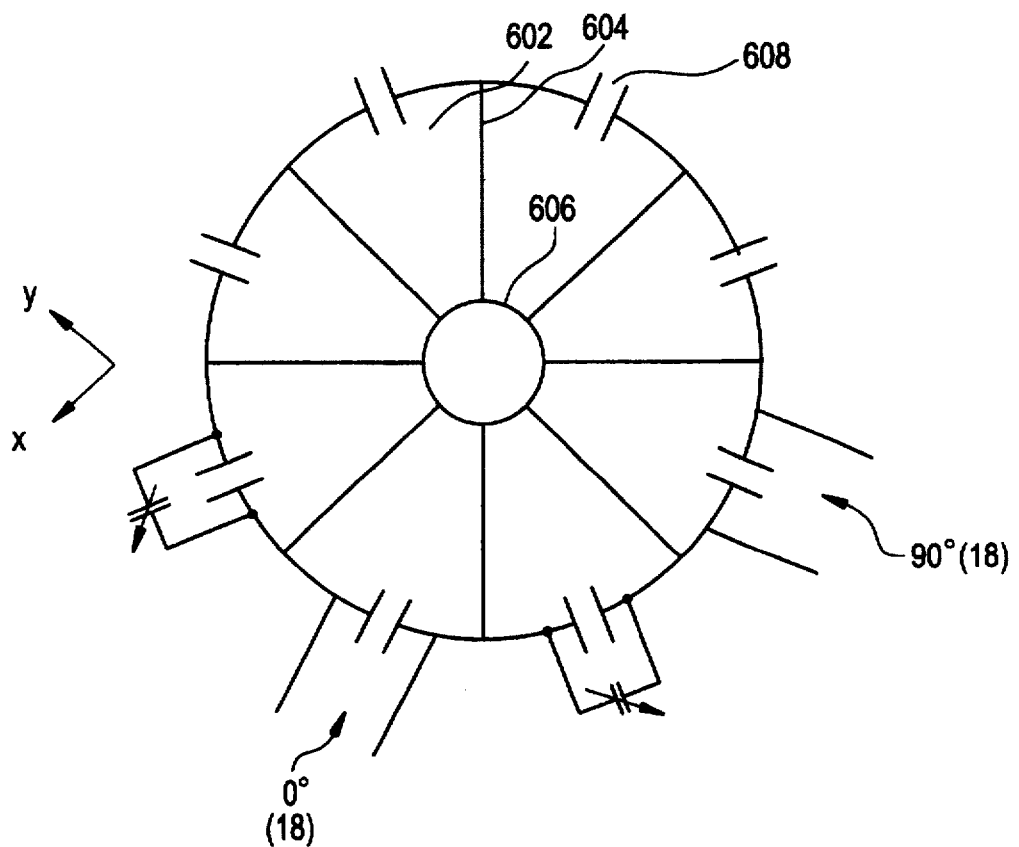
FIG. 4 illustrates an electric circuit of the transmit coil section in the apparatus of FIG. 1.

The electric circuit of the transmit coil section 6 is shown in FIG. 4. As shown, the annular electric path 602 partitioned by the radially extending electric paths 604 into subsections has respective capacitors 608 connected in series in the subsections. It should be noted that designation for the capacitors 608 is represented by the reference numeral at one position in the drawing. Some of the capacitors are connected in parallel with respective variable capacitors for adjusting the capacitance. The variable capacitors are used to precisely adjust orthogonality between a phase of 0° and a phase of 90°.

The RF signals having phases of 0° and 90° are applied from the transmitter section 18 to both ends of the respective capacitors 608 that are disposed in two subsections having respective directions from the center different by 90° from each other.

Figure 5:
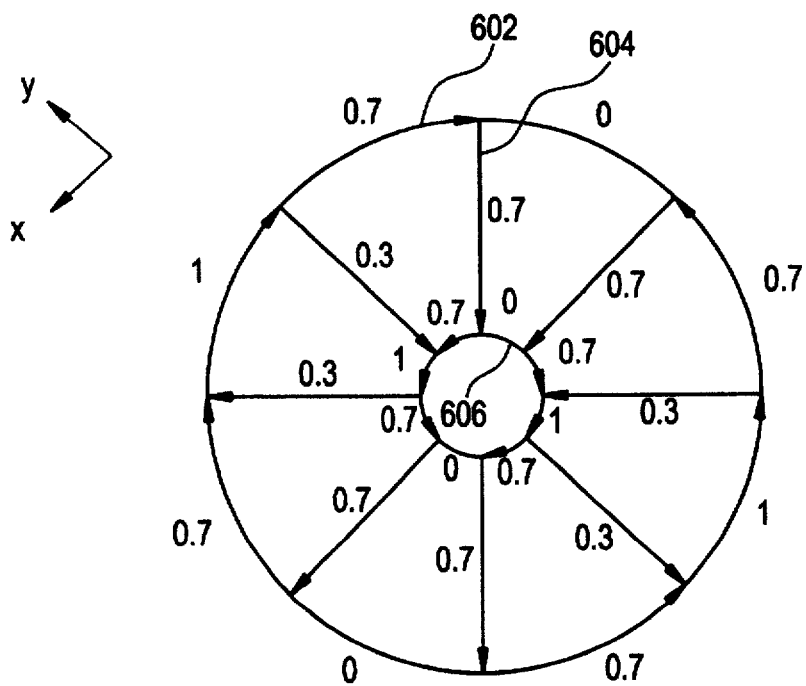
FIG. 5 illustrates an electric distribution in the transmit coil section in the apparatus of FIG. 1.

Now consider the RF signal having a phase of 0°. The proportions of the electric current flowing through the electric paths are shown in FIG. 5. Specifically, in the outer annular electric path 602, a subsection to which the RF signal is supplied and a subsection opposite thereto have an electric current proportion of 0°, two subsections that have directions 90° apart from the above two subsections have an electric current proportion of 1, and the remaining subsections have an electric current proportion of 0.7. The subsections in the inner annular electric path 606 have respective electric current proportions similar to those in the corresponding subsections of the outer electric path 602.

In the radially extending electric paths 604, the electric current proportions are 0.7 for four electric paths lying on both sides of the two subsections in the annular electric path 602 that have an electric current proportion of 0, and the electric current proportions are 0.3 for four electric paths lying on both sides of the two subsections in the annular electric path 602 that have an electric current proportion of 1.

At one polarity of the RF signal, the electric current directions in the electric paths are those indicated by arrows in FIG. 5. Specifically, in the outer annular electric path 602, the electric current flows counterclockwise and clockwise respectively on the right and left sides in the drawing relative to the subsections having an electric current proportion of 0, and in the inner annular electric path 606, the electric current flows inversely to the directions in the outer annular electric path 602. In the radially extending electric paths 604, the electric current bifurcated from the above electric current flows in the opposite directions for each pair of the electric paths 604 aligned symmetrically relative to the center.

Figure 6:
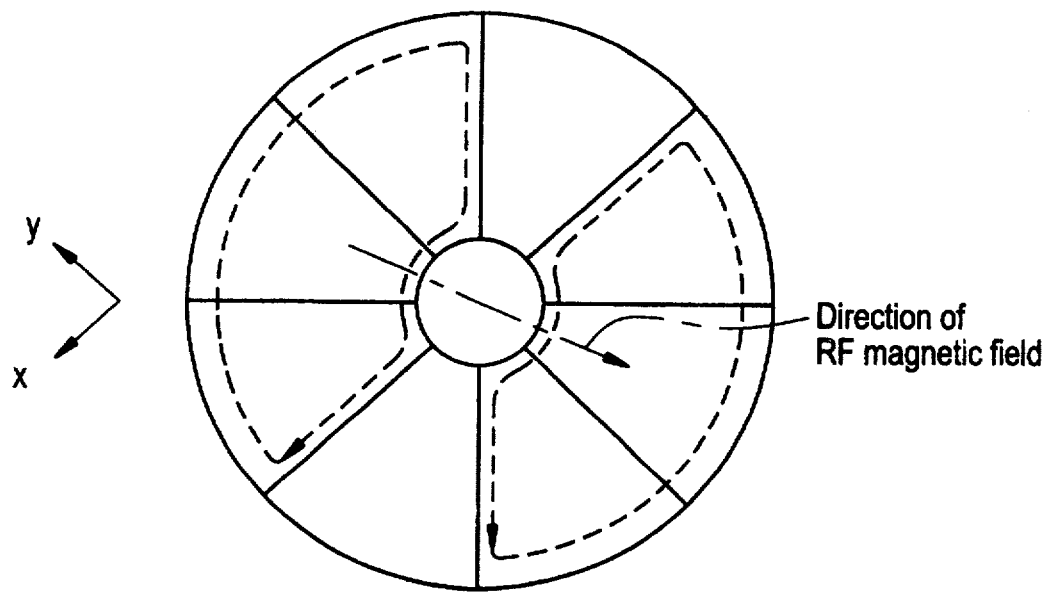
FIG. 6 illustrates an RF magnetic field generated by the transmit coil section in the apparatus of FIG. 1.

Such electric current generates a magnetic field in the diameter direction perpendicular to the electric paths having an electric current proportion of 1, as indicated by dot-dash arrow in FIG. 6, on the reverse side of the inner annular electric path 606 in the drawing, i.e., on the side facing the transmit coil section 6'.

At the other polarity of the RF signal, the electric current directions are totally inverted relative to the above-described directions, thereby inverting the magnetic field direction. Thus, the transmit coil section 6 generates an RF magnetic field corresponding to the RF signal.

Figure 7:
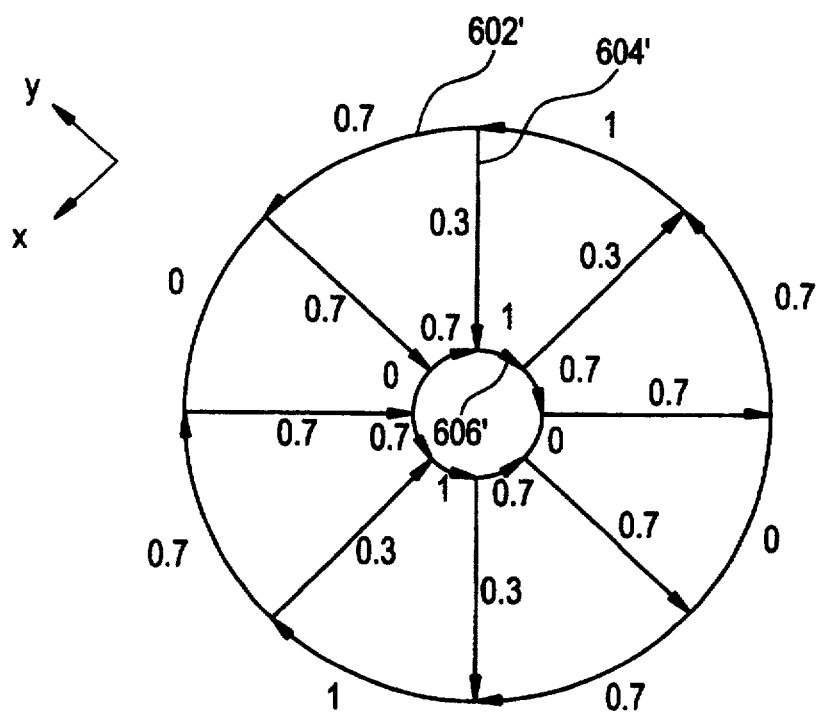
FIG. 7 illustrates an electric distribution in the transmit coil section in the apparatus of FIG. 1.
Figure 8:
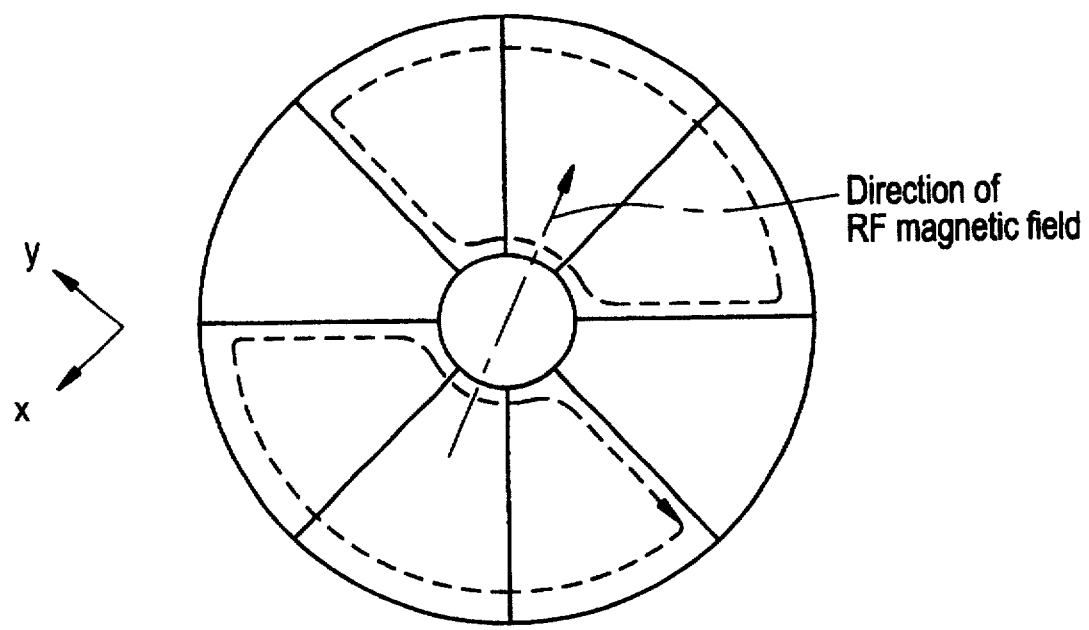
FIG. 8 illustrates an RF magnetic field generated by the transmit coil section in the apparatus of FIG. 1.

Considering the electric current having a phase of 90°, at one polarity of the RF signal, the electric current proportions of the electric paths are those shown in FIG. 7. Because the RF signal supply position is spatially apart from the supply position for the RF signal having a phase of 0° by 90°, FIG. 7 is identical to FIG. 5 rotated counterclockwise by 90°. Accordingly, the RF magnetic field direction is rotated from that shown in FIG. 6 counterclockwise by 90°, as indicated by dot-dash arrow in FIG. 8.

The transmit coil section 6 generates an RF magnetic field as a resultant vector of the above two RF magnetic fields. Since the two RF magnetic fields have a phase difference of 90°, the resultant RF magnetic field becomes a rotary magnetic field that rotates at the frequency of the RF signal. Thus, the transmit coil section 6 acts as a quadrature RF coil.

The transmit coil section 6' has the same circuit configuration and generates a similar rotary magnetic field. However, the electric current directions in the electric paths are totally inverted in the transmit coil section 6' relative to those in the transmit coil section 6 that has a mirror-image relationship to the transmit coil section 6'. Such inversion of the electric current directions can be easily achieved by, for example, inverting the connections of the signal lines to both ends of the capacitors 608. In this case, an RF magnetic field generated immediately above the inner annular electric path 606', i.e., generated on the side facing the transmit coil section 6, has the same direction as the direction of the aforementioned magnetic field generated from the transmit coil section 6, thereby forming an RF magnetic field by summing these magnetic fields.

Figure 9:
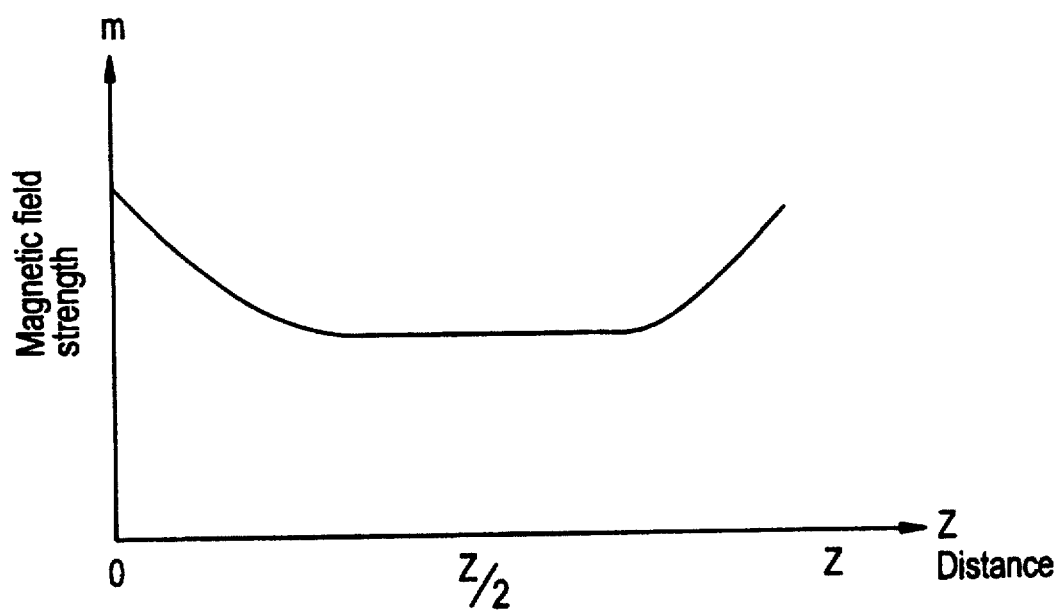
FIG. 9 illustrates a strength distribution of the RF magnetic field generated by the transmit coil sections in the apparatus of FIG. 1.

Thus, an RF magnetic field is generated rotating in a plane perpendicular to the z-direction in a space between the transmit coil sections 6 and 6'. As exemplarily shown in FIG. 9, the intensity profile of the RF magnetic field in the z-direction has homogeneity over a wide range containing the center of the static magnetic field (Z/2) by summing up the RF magnetic fields generated from the two coils.

Figure 10:
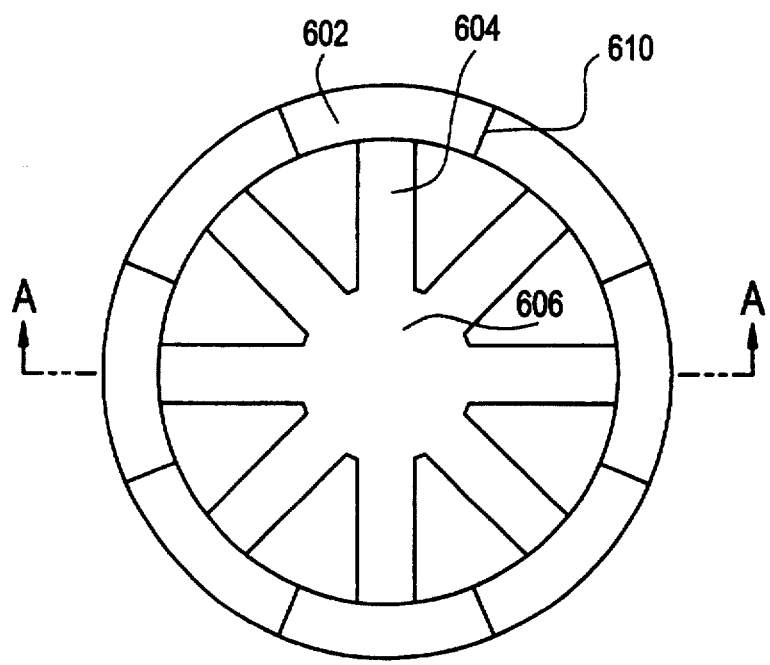
FIG. 10 illustrates an exemplary electric path pattern in the transmit coil section in the apparatus of FIG. 1.

The electric paths of the transmit coil sections 6 and 6' are constructed from a conductive foil, for example. An exemplary circuit pattern of the transmit coil section 6 constructed from the conductive foil is shown in FIG. 10. As shown, all of the electric paths 602, 604 and 606 are constructed from a conductive material such as a copper foil. The thickness of the copper foil is in the range of about 10–100 micrometers, for example. The width of the electric paths 602 and 604 is about a few centimeters or ten or more centimeters, for example. It should be noted that the circuit pattern is constructed on a support member (not shown).

The annular electric path 602 has respective slits 610 in the subsections, and the capacitors 608 are disposed within the slits 610 for connecting the electric path 602 in series. It should be noted that the capacitors 608 are omitted in FIG. 10. In addition, designation for the slits 610 is represented by the reference numeral at one position in the drawing.

By constructing the radially extending electric paths 604 as electric paths having a large width, the ratio of a portion between the adjacent electric paths 604 that does not carry electric current can be significantly reduced as compared to the electric paths 604 constructed from a wire. This can mitigate reduction in the magnetic field strength in the intermediate portion between the adjacent electric paths 604, thereby mitigating the degree of inhomogeneity of the magnetic field strength distribution.

The electric path 606 is not constructed as an annulus as described above but as a disk with its central portion closed. Since the electric current flows distributed over the entire disk, unlike the annulus, reduction of the magnetic field at the central portion due to the absence of electric current at the central portion can be avoided, resulting in proper magnetic field generation.

Figure 11:
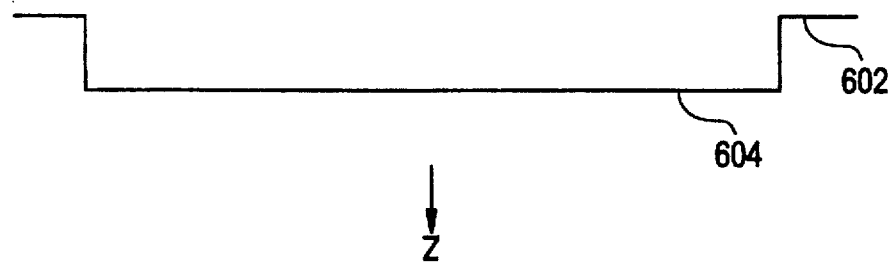
FIG. 11 is a cross-sectional view taken along line A—A of the electric path pattern shown in FIG. 10.

Between the annular electric path 602 and the radially extending electric paths 604, shoulders are provided. Specifically, as shown in a cross-sectional view of FIG. 11 taken along line A—A, the shoulders are provided so that the annular electric path 602 is disposed farther from the center of the static magnetic field than the radially extending electric paths 604 from the center of the static magnetic field. Thus, the distance between the subject 8 placed within the static magnetic field space and the annular electric path 602 is increased, thereby reducing cancellation effect of the annular electric path 602 on the RF excitation magnetic field.

Therefore, the excitation electric power to obtain a predetermined RF magnetic field strength can be reduced, allowing efficient RF excitation. Moreover, since the RF current flowing through the electric paths can be reduced correspondingly, the whole SAR of the subject 8 can be reduced. Furthermore, by increasing the distance between the subject 8 and the annular electric path 602, the local SAR of the subject 8 is reduced in association with a decrease of the electric current.

The circuit pattern of the transmit coil section 6' is configured in a mirror-image relationship to that of the transmit coil section 6. Thus, the distance between the subject 8 and the annular electric path 602' is increased, thereby reducing cancellation effect of the annular electric path 602' on the RF excitation magnetic field. Therefore, efficient RF excitation can be achieved while reducing the whole and local SAR's, in a similar manner as above.

Figure 12:
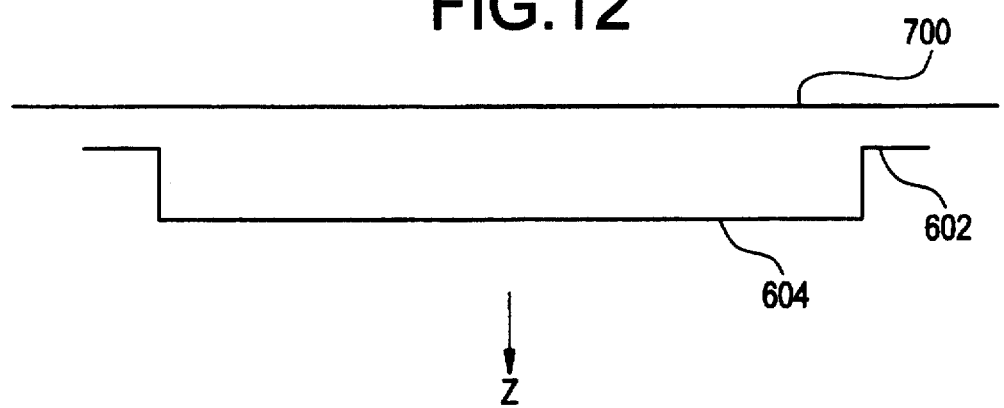
FIG. 12 is a cross-sectional view taken along line A—A of the electric path pattern shown in FIG. 10, in combination with a cross-sectional view of an RF shield.

By providing the shoulders, the distance between an RF shield 700, which is provided between the gradient coil section 4 and the transmit coil section 6, and the electric path 602 is reduced, as exemplarily shown in FIG. 12. Thus, the RF current flowing through the electric path 602 has a greater mirror effect. The mirror effect causes a condition equivalent to giving rise to electric current (mirror current) having a polarity opposite to the RF current flowing through the electric path 602, along a position symmetrical to the electric path 602 with respect to the RF shield 700. Therefore, an increase of the mirror effect enhances cancellation effect of the mirror current, and the RF magnetic field caused by the electric current flowing through the electric path 602 is canceled. Thus, the efficiency in the RF excitation is more improved and the whole and local SAR's of the subject 8 are more reduced.

Figure 13:
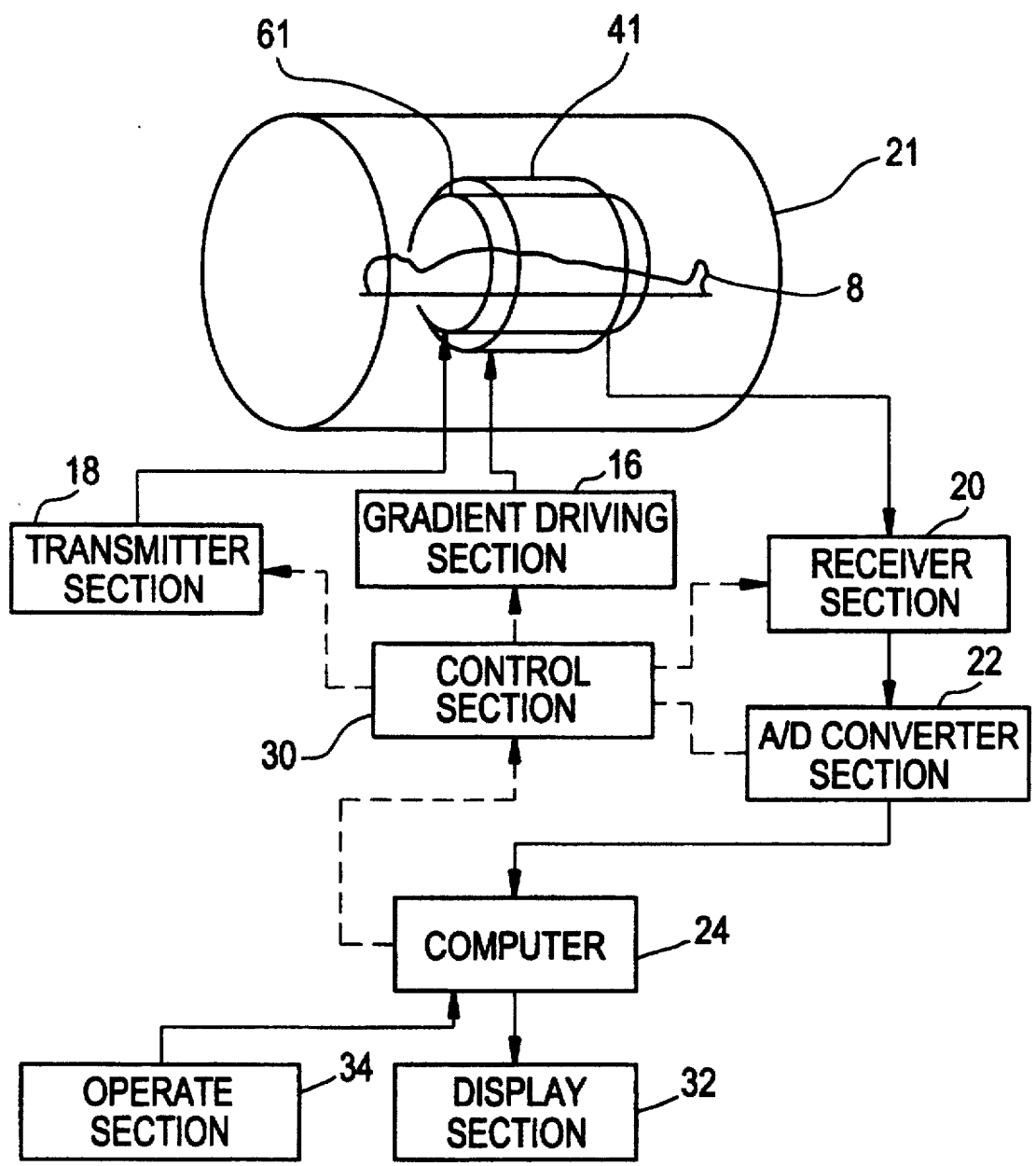
FIG. 13 is a block diagram of an apparatus in accordance with another embodiment of the present invention.

FIG. 13 shows another exemplary magnetic resonance imaging apparatus, which is another embodiment of the present invention. The configuration of the apparatus represents an embodiment of the apparatus in accordance with the present invention, and the operation of the apparatus represents an embodiment of the method in accordance with the present invention.

In FIG. 13, parts similar to those shown in FIG. 1 are designated by the same reference numerals and explanation thereof will be omitted. As shown in FIG. 13, the apparatus has a generally cylindrical static magnetic field generating section 21, which represents an embodiment of the static magnetic field generating means of the present invention. The static magnetic field generating section 21 is constructed from a superconductive electromagnet, for example. The static magnetic field generating section 21 generates a static magnetic field within its internal space. The direction of the static magnetic field is generally in parallel to the body axis of the subject 8, and hence the static magnetic forms a so-called horizontal magnetic field.

Within the internal space of the static magnetic field generating section 21 is disposed a generally cylindrical gradient coil section 41, inside which a body coil section 61 is disposed. An RF shield (not shown) is provided between the gradient coil section 41 and the body coil section 61. The subject 8 is placed within the internal space of the body coil section 61.

The body coil section 61 is driven by the transmitter section 18 to generate an RF magnetic field. The body coil section 61 also detects magnetic resonance signals generated from the subject 8 and supplies the signals to the receiver section 20. That is, the body coil section 61 is used for transmission and reception of RF signals.

Figure 14:
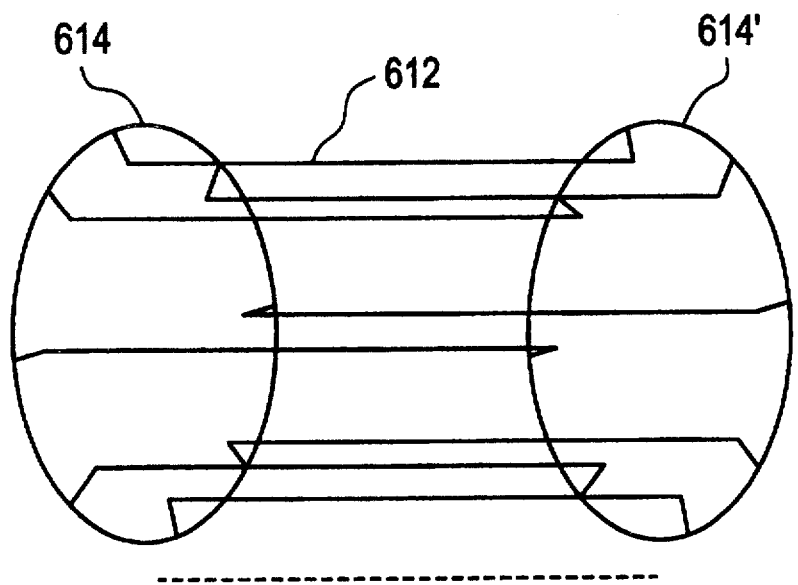
FIG. 14 is a schematic showing the configuration of a body coil section in the apparatus of FIG. 13.

FIG. 14 schematically shows the configuration of the body coil section 61. As shown, the body coil section 61 has a plurality of mutually parallel electric paths 612. It should be noted that designation for the electric paths 612 is represented by the reference numeral at one position. The electric paths 612 represent an embodiment of the plurality of mutually parallel electric paths of the present invention. The both ends of the plurality of electric paths 612 are linked by annular electric paths 614 and 614'. The annular electric paths 614 and 614' represent an embodiment of the annular electric paths of the present invention.

Each of the annular electric paths 614 and 614' is provided with capacitors (not shown) in subsections formed by the connection points of the plurality of electric paths 612. Either one of the annular electric path 614 or 614' is provided with RF signal electric power supply portions (not shown) at two positions thereon having respective directions from the center of the annulus different by 90° from each other. The electric power supply portions are also used for picking up the RF signals. The RF coil of this kind is sometimes referred to as a birdcage coil.

In such a birdcage coil, it is the plurality of electric paths 612 that contribute to generation of an RF excitation magnetic field. The annular electric paths 614 and 614' on both ends do not contribute the generation of the excitation magnetic field but serve as return paths for the RF electric current.

Figure 15:
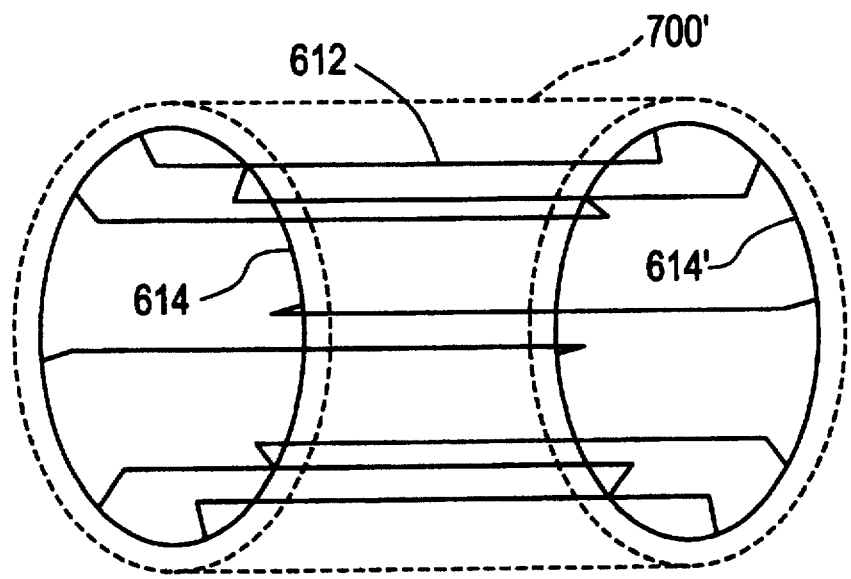
FIG. 15 is a schematic showing the configuration of the body coil section and an RF shield in the apparatus of FIG. 13.

The diameter of the annular electric paths 614 and 614' is larger than that of a cylindrical space formed by an array of the plurality of electric paths 612, and both ends of the electric paths 612 are bent toward the outside of the cylindrical space in order to be connected to the annular electric paths 614 and 614'. Thus, the annular electric paths 614 and 614' lie farther from the subject 8 placed within the cylindrical space than the electric paths 612 from the subject 8. Accordingly, cancellation effect of the annular electric paths 614 and 614' on the excitation magnetic field is reduced, improving efficiency in excitation. In addition, the whole and local SAR's of the subject 8 is reduced. These effects are further enhanced by an increase of the mirror effect from the annular electric paths 614 and 614' approaching an RF shield 700' disposed between the body coil section 61 and the gradient coil section 41, as shown in FIG. 15.

Now the operation of the present apparatus will be described. While the description will be made with reference to the operation of the apparatus shown in FIG. 1, the same applies to the operation of the apparatus shown in FIG. 13. The operation of the apparatus proceeds under the control of the control section 30. As an exemplary magnetic resonance imaging procedure, imaging with a gradient echo technique will be described. It should be noted that the magnetic resonance imaging is not limited to being performed with the gradient echo technique but may be performed with any other appropriate technique such as a spin echo or EPI (echo-planar imaging) technique.

In imaging with the gradient echo technique, a pulse sequence such as that exemplarily shown in FIG. 16(A)–16(D) are employed. The pulse sequence proceeds from the left to the right along a time axis 't'. The execution of the pulse sequence is controlled by the control section 30.

Figure 16A:
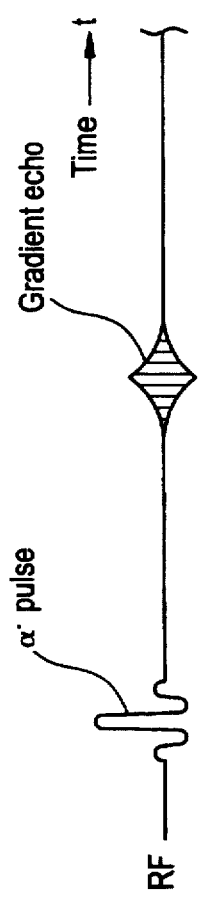

As shown in FIG. 16(A), RF excitation is performed with an $\alpha°$ pulse. Since the configuration of the RF coil and the mirror effect as described above enables efficient RF excitation while maintaining low whole and local SAR's of the subject 8, the whole and local temperature increase of the subject 8 can be reduced.

Figure 16B:
Figure 16C:
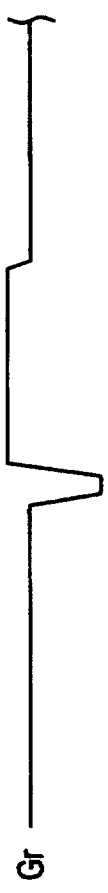

The RF excitation is achieved with a good homogeneity over a wide range. In the RF excitation, a slice gradient magnetic field Gs is applied as shown in FIG. 16(B). Spins in a predetermined site in the subject 8 are thus selectively excited. Following the selective excitation, the spins are rephased by the gradient magnetic field Gs.

Figure 16D:
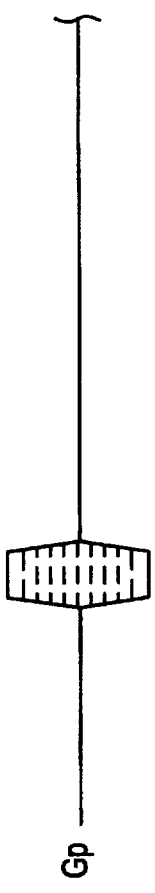

Next, phase encoding is performed by a phase encoding gradient magnetic field Gp as shown in FIG. 16(D). Then, the spins are dephased by a readout gradient magnetic field Gr, and subsequently the polarity of the gradient magnetic field is inverted to read out a magnetic resonance signal (gradient echo).

By repeating such a pulse sequence in a predetermined repetition time TR, each respective gradient echo is acquired. The magnitude of the phase encoding gradient magnetic field Gp is varied for each TR, and magnetic resonance signals for a plurality of views are collected in a memory. The computer 24 performs a two-dimensional inverse Fourier transformation on the data collected in the memory and produces a tomographic image of the imaging site. The tomographic image is displayed at the display section 32.

Many widely different embodiments of the invention may be configured without departing from the spirit and the scope of the present invention. It should be understood that the present invention is not limited to the specific embodiments described in the specification, except as defined in the appended claims.

What is claimed is:

1. An RF coil apparatus comprising:
    a pair of planar coil devices disposed parallel to each other and forming a space therebetween for placement of a subject, said space having an area for an RF magnetic field, each of said devices comprising:
        a first annular electric path having a first diameter;
        a plurality of radially extending electric paths, each having two ends, and each being connected at one end to said first annular electric path, said plurality of radially extending electric paths providing a main RF magnetic field in said area of said space, and
        a second annular electric path having a second diameter larger than said first diameter and connected to other ends of said plurality of radially extending electric paths, said second annular electric path being disposed a distance from said area at which said main RF magnetic field is provided; and
    RF signal supply means for supplying at least two separate RF signals to said second annular electric path at positions which are 90° from each other, whereby
    RF magnetic field produced by said second annular electric path has a reduced cancellation effect on said main RF magnetic field provided by said plurality of radially extending electric paths in said area of said space.

2. The apparatus of claim 1, further comprising a magnetic shield disposed on at least one side of said pair of plan coil devices.

3. The apparatus of claim 1, wherein each of said devices comprises said plurality of radially extending electric paths disposed in a first plane, and said second annular electric path disposed in a second different plane located above said first plane so that distance thereof from said area is further than said plurality of radially extending electric paths providing a main RF magnetic field thereto.

4. The apparatus of claim 1, wherein said plurality of radially extending electric paths are of a number 4N, wherein N is an integer of at least one.

5. The apparatus of claim 3, further comprising a flat RF shield disposed above said second plane.

6. The apparatus of claim 1, wherein each of said devices further comprises a capacitor disposed in said second annular electric path between connections of said second annular electric path and other ends of said plurality of radially extending electric paths.

7. The apparatus of claim 1, wherein said RF power supply means comprises a power splitter for providing equal power for each of said two separate RF signals.

8. The apparatus of claim 1, wherein said RF power supply means comprises a concentric cable.

9. The apparatus of claim 1, wherein said first annular electric path, said plurality of radially extending electric paths, and said second annular electric path comprise copper foil, of a thickness ranging from 10 to 100 micrometers, and of a width of from few centimeters to more than 10 centimeters.

10. The apparatus of claim 1, wherein said pair of planar coil devices are disposed in a mirror image relationship to each other so that the distance between said area and said second annular electric path is increased so that cancellation effect of magnetic field produced by said second annular electric path on said main RF magnetic field produced by said plurality of radially extending electric paths, is reduced.

11. The apparatus of claim 1, wherein, in each of said pair of devices, said first annular electric path, said plurality of radially extending electric paths, and said second annular electric path, are of a flat broad conductor, and wherein said first annular electric path forms a closed circle.

12. The apparatus of claim 1, wherein each of said first annular electric path, said plurality of radially extending electric paths and said second annular electric path, are made of conductive wire.

13. An RF coil apparatus comprising:

a plurality of parallel extending electric paths defining a cylindrical cage of a first diameter and forming a space thereby for placement of a subject, each of said plurality of parallel paths having two end and carrying electric current to produce a main RF magnetic filed directed at an area in said space, and wherein each of said plurality of parallel extending electric paths having end portions thereof directed to respective ends thereof which are of a diameter larger than said first diameter; and a pair of annular electric paths connected to respective two ends of each of said plurality of parallel extending electric paths, said annular electric paths having a diameter about the same as that of the end portions of said plurality of parallel extending electric paths, so that said pair of annular electric paths are at a distance from said area whereat said main RF magnetic filed is directed so that RF magnetic field produced by said pair of annular electric paths has reduced influence on said main RF magnetic filed produced by said plurality of parallel extending electric paths.

14. The apparatus of claim 13, further comprising a circular cylindrical RF magnetic shield surrounding said cylindrical cage formed by said plurality of parallel extending electric paths.

15. A magnetic resonance imaging apparatus comprising:

static magnetic field generating means for generating a static magnetic field within a space containing a subject;

gradient magnetic field generating means for generating a gradient magnetic field in said space;

RF magnetic field generating means for generating an RF magnetic field in said space, said RF magnetic field generating means comprising:

a pair of planar coil devices disposed parallel to each other and forming said space therebetween for containing said subject, said space having an area for a main RF magnetic field, each of said devices comprising:

a first annular electric path having a first diameter;

a plurality of radially extending electric paths, each having two ends, and each being connected at one end to said first annular electric path, said plurality of radially extending electric paths providing said main RF magnetic field in said area of said space; and a second annular electric path having a second diameter larger than said first diameter and connected to other ends of said plurality of radially extending electric paths, said second annular electric path being disposed a distance from said area at which said main RF magnetic field is provided; and RF signal supply means for supplying at least two separate RF signals to said second annular electric path at positions which are 90° from each other, whereby RF magnetic field produced by said second annular electric path has a reduced cancellation effect on said main RF magnetic field provided by said plurality of radially extending electric paths in said area of said space;

measuring means for measuring magnetic resonance signals from said area in said space; and image producing means for producing an image based on the magnetic resonance signals measured by said measuring means.

16. The apparatus of claim 15, further comprising an RF magnetic shield disposed between said RF magnetic field generating means and said gradient magnetic field generating means.

17. A magnetic resonance imaging apparatus comprising:

static magnetic field generating means for generating a static magnetic field within a space containing a subject;

gradient magnetic field generating means for generating a gradient magnetic field in said space;

RF magnetic field generating means for generating an RF magnetic field in said space, said RF magnetic field generating means comprising:

a plurality of parallel extending electric paths defining a cylindrical cage of a first diameter and forming said space thereby for placement of a subject, each of said plurality of parallel paths having two ends and carrying electric current to produce a main RF magnetic field directed at an area in said space, and wherein each of said plurality of parallel extending electric paths having end portions thereof directed to respective ends thereof which are of a diameter larger than said first diameter; and a pair of annular electric paths connected to respective two ends of each of said plurality of parallel extending electric paths, said annular electric paths having a diameter about the same as that of the end portions of said plurality of parallel extending electric paths, so that said pair of annular electric paths are at a distance from said area whereat said main RF magnetic field is directed so that RF magnetic field produced by said pair of annular electric paths has reduced influence on said main RF magnetic field produced by said plurality of parallel extending electric paths;

measuring means for measuring magnetic resonance signals from said area in said space; and image producing means for producing an image based on the magnetic resonance signals measured by said measuring means.

18. The apparatus of claim 17, further comprising a circular cylindrical magnetic shield surrounding said cylindrical cage formed by said plurality of parallel extending electric paths.

* * * * *